United States Patent [19]
Watanabe et al.

[11] Patent Number: 5,279,670
[45] Date of Patent: Jan. 18, 1994

[54] VERTICAL TYPE DIFFUSION APPARATUS

[75] Inventors: Singo Watanabe, Aikawa; Wataru Okase, Sagamihara, both of Japan

[73] Assignee: Tokyo Electron Sagami Limited, Kanagawa, Japan

[21] Appl. No.: 674,884

[22] Filed: Mar. 26, 1991

[30] Foreign Application Priority Data

| Mar. 31, 1990 | [JP] | Japan | 2-86092 |
| Jul. 10, 1990 | [JP] | Japan | 2-180692 |
| Jul. 10, 1990 | [JP] | Japan | 2-180693 |

[51] Int. Cl.$^5$ ............................................. C23C 16/00
[52] U.S. Cl. ..................................... 118/725; 118/715; 118/724
[58] Field of Search ................. 118/724, 725, 719, 715

[56] References Cited

U.S. PATENT DOCUMENTS

| 4,096,822 | 6/1978 | Yamanaki et al. | 118/500 X |
| 4,798,165 | 1/1989 | deBoer et al. | 118/715 |
| 4,989,540 | 2/1991 | Fuse et al. | 118/725 X |
| 5,146,869 | 9/1992 | Bohannon et al. | 118/724 |

FOREIGN PATENT DOCUMENTS

| 61-114522 | 2/1986 | Japan. | |
| 62-154722 | 7/1987 | Japan | 118/715 |

*Primary Examiner*—Brian E. Hearn
*Assistant Examiner*—Jonathan D. Baskin
*Attorney, Agent, or Firm*—Oblon, Spivak, McClelland, Maier & Neustadt

[57] ABSTRACT

An oxidation apparatus for applying oxidation treatment to a plurality of semiconductor wafers includes a vertical-type reaction tube in which the wafers are housed, and an outer tube coaxially located outside the reaction tube with a space interposed between them. A heater is located enclosing the outer tube. The space between both of the tubes serves as a passage for pre-heating a treating gas passing through the space. A pipe for supplying the treating gas into the space is connected to the lower portion of the outer tube. A diffusion plate is formed at the top of the reaction tube and it is provided with a plurality of diffusion holes through which the treating gas is introduced into the reaction tube after the gas passes through the space. The space between both of the tubes is partitioned by a spiral pipe made of quartz and the gas pre-heating passage is thus formed spiral extending from the gas supply pipe to the diffusion plate. A pipe for discharging the treating gas outside the reaction tube is connected to the lower portion of the reaction tube.

20 Claims, 7 Drawing Sheets

VERTICAL TYPE DIFFUSION APPARATUS

BACKGROUND OF THE INVENTION

1. Field of the Invention

The present invention relates to a diffusion apparatus of the vertical type and, more particularly, an oxidation apparatus (which will be explained as a kind of diffusion apparatus hereinafter).

2. Description of the Related Art

As the integrated density of LSIs becomes higher, the minimum width of a 4M DRAM design has become smaller than 1 µm and the thickness of gate oxide film has become smaller than 200Å, too. The gate oxide particularly in the case of 16M DRAM has this tendency of its becoming thinner than 100Å.

When the film thickness of the oxide film ha become small like this it is quite difficult to satisfy the need that the thickness of the film formed on a semiconductor wafer must be uniform.

In order to meet this need, it is necessary that treatment is uniformly applied onto the semiconductor wafers. It is an extremely important matter that temperature condition is uniform particularly at the oxidation treatment.

The vertical-type heat treatment furnace is usually more suitable for manufacturing high density elements, as compared with the horizontal-type heat treatment furnace, because temperature gradient can be made smaller in the axial direction of the batch process furnace, temperature gradient in the horizontal plane can be made smaller by rotating wafers, and a wafer boat can be loaded and unloaded without touching an inner surface of a process tube. The vertical-type heat treatment furnace has been therefore more widely used in this field these days.

According to the studies conducted by us inventors, however, it has been confirmed in the case of the conventional vertical-type diffusion furnace that gas introduced into the reaction tube is not diffused in the radial direction of the tube but it flows downward because the treating normal gas is introduced into the tube through the top thereof, and that the treating gas which is contacted with each of the semiconductor wafers in the reaction tube is thus different in temperature, depending upon the location of each of the wafers. Therefore, satisfactory thermal uniformity in the radial direction (which will also be hereinafter referred to as sectional thermal uniformity) cannot be created on each of the wafers in the conventional vertical-type diffusion furnace, thereby making it impossible for this furnace to be used to manufacture higher density elements than 4M.

SUMMARY OF THE INVENTION

The object of the present invention is therefore to provide a diffusion apparatus of the vertical type wherein the system for supplying the treating gas into the reaction tube is improved to enhance the sectional thermal uniformity of an object to be treated, and to realize the uniformity of film thickness on the object. More specifically, the present invention is intended to uniformly introduce the treating gas into the reaction tube.

According to the present invention, there can be provided a diffusion apparatus of the vertical type for heat-treating a plurality of objects mounted with intervals therebetween in the vertical direction with a treating gas comprising a vertical-type reaction tube in which the objects are housed, an outer tube co-axially located outside the reaction tube with a space interposed between them, said space being used as a passage for pre-heating the treating gas passing through the space, a heater means surrounding the outer tube, a means connected to one end of the space to supply the treating gas into the reaction tube, a diffusion plate located at the reaction tube at the other end of the space, a plurality of diffusion holes formed at the diffusion plate to introduce the treating gas into the reaction tube after the gas passes through the space, and a means for discharging the treating gas outside the reaction tube.

According to a normal aspect of the present invention, the one end of the space between both of the reaction and outer tubes is located at the lower portion of the reaction tube and the other end thereof is located on the top of the reaction tube.

According to a preferable aspect of the present invention, the diffusion plate has a closed portion at the center thereof and the diffusion holes formed at the diffusion plate are arranged substantially point-symmetrical relative to the center of the cross section of the reaction tube. A distance separating the outer tube from the reaction tube is largest in the vicinity of the diffusion plate, thereby decreasing gas flow rate through the region.

The diffusion plate defines the top of the reaction tube. Or it is located in the reaction tube under the top thereof and the top of the reaction tube is provided in this case with an opening through which the treating gas is introduced into the reaction tube.

According to a further aspect of the present invention, the space between both of the reaction and outer tubes is partitioned by a spiral rod made of quartz and the gas pre-heating passage is thus made spiral, extending from the gas supply means to the diffusion plate.

According to a still further aspect of the present invention, a distributor ring made of quartz and having plural gas distributing holes is located adjacent to the gas supply means in the space between both of the reaction and outer tubes to uniformly distribute the treating gas around the outer circumference of the reaction tube. The open area of the distributing holes per unit length of the ring becomes smaller as it comes nearer to the gas supply means. The distributing holes are arranged symmetrical in shape relative to the center of the gas supply means.

According to the vertical-type diffusion apparatus of the present invention, the treating gas is heated to treatment temperature by the heater while passing through the gas introducing passage. This enables the treating gas to be pre-heated to a temperature approximate to the gas temperature in the reaction tube when it is introduced into the reaction tube. In addition, the space between the reaction and outer tubes which are arranged concentrically to each other is used as the gas pre-heating passage. Therefore, the sectional area of the passage can be made larger and the speed at which the treating gas is supplied can be made lower, thereby keeping sufficient the time period during which the treating gas is preheated. Difference between the gas temperature in the reaction tube and the temperature of the treating gas introduced into the reaction tube can be made smaller in this manner. Therefore, the downward flow of the treating gas which has been introduced into the reaction tube can be reduced to a greater extent and the gas can be diffused so much in the radial direction of the reaction tube, thereby enhancing the sectional thermal uniformity on each of the objects to be treated. Further, the diffusion plate is located at that portion of the reaction tube through which the treating gas is introduced, and this diffusion plate forces the treating gas to be introduced into the reaction tube while diffusing it uniformly in the radial direction of the reaction tube. This enables the sectional thermal uniformity to be kept higher.

In the case where the gas pre-heating passage is formed spiral by the spiral rod made of quartz, the time period during which the treating gas is preheated can be made so longer as to heat the gas to a predetermined temperature with a higher certainty.

In the case where the distributor ring made of quartz is located in the gas pre-heating passage, the treating gas can be distributed uniformly around the outer circumference of the reaction tube, so that the pre-heating of the treating gas can be more efficiently conducted without an maldistribution of the gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
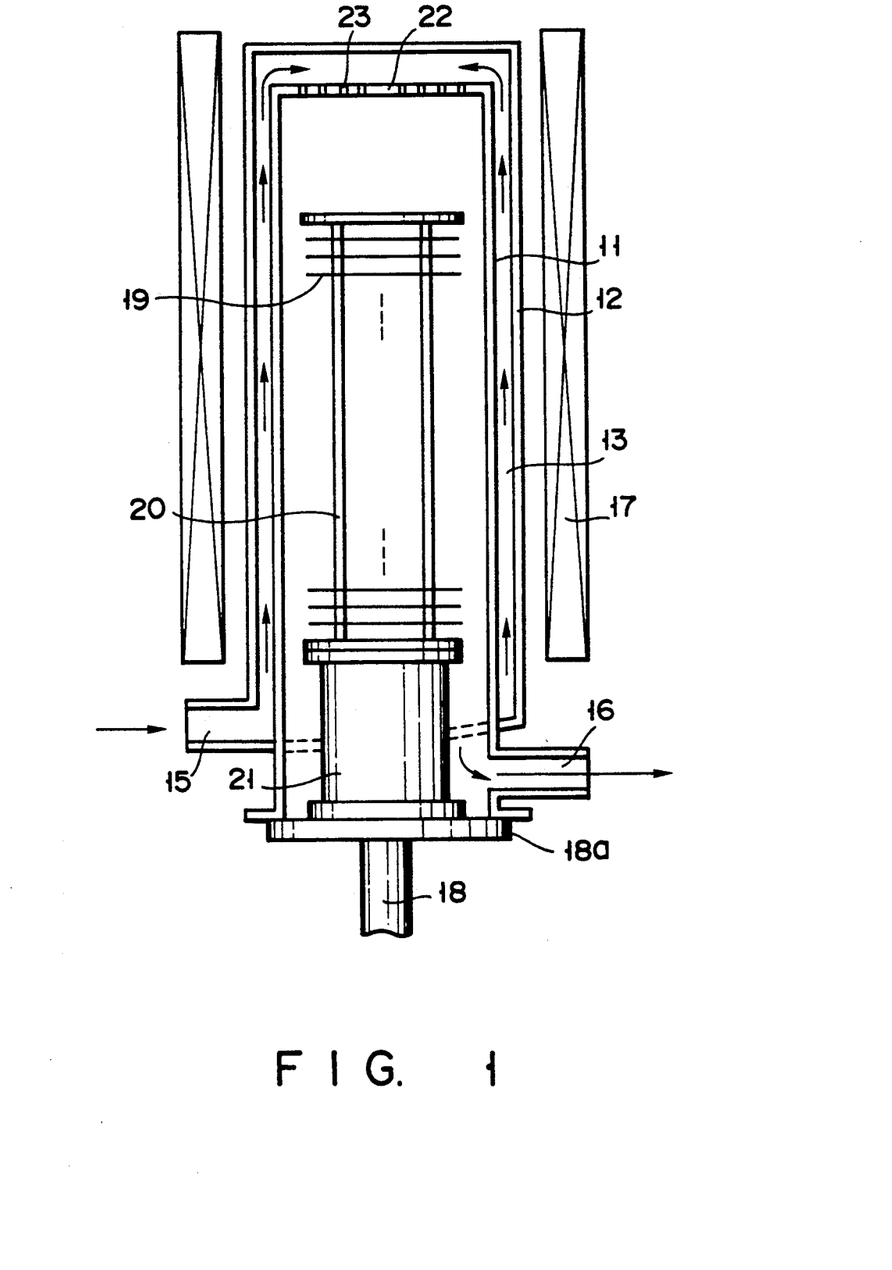
FIG. 1 is a schematic sectional view showing the vertical-type diffusion apparatus according to a first embodiment of the present invention.

FIG. 1 shows a structure of the vertical-type diffusion apparatus according to a first embodiment of the present invention. A reaction tube 11 is made of quartz and formed as cylinder having a height of about 1160 mm, an inner diameter of about 285 mm and a thickness of about 4 mm, for example. The reaction tube 11 is made open at the lower end thereof and supported vertical so that a boat 20, on which a plurality of wafers 19 are mounted horizontal with a certain interval interposed between the adjacent wafers 19 in the vertical direction, may be put into and pulled out of the reaction tube 11. Some of the wafers 19 located at the upper and lower portions of the boat 20 are dummies. The boat 20 is supported vertical by a heat insulating cylinder 21 and this heat insulating cylinder 21 is supported by a boat elevator 18, which is driven up and down to put and pull the boat 20 into and out of the reaction tube 11. When the boat 20 is put in the reaction tube 11 as shown in FIG. 1, the opened lower end of the reaction tube 11 is closely closed by a flange 18a of the boat elevator 18. The above arrangement is well-known to those persons who have knowledge in this field and further detailed description on it will be omitted accordingly.

An outer tube 12 is supported vertical outside the reaction tube 11 and coaxial to the latter to form a ring-shaped space between them. The outer tube 12 is made of quartz and formed as a cylinder having a thickness of about 4 mm. The outer tube 12 is separated from the reaction tube 11 by about 8 mm at the side thereof and by about 16 mm at the top thereof.

A gas supply pipe 15 having an inner diameter of about 16 mm is connected to the lower side of the outer tube 12 and the space between the tubes 11 and 12 serves as a gas introducing and pre-heating passage 13. A pipe 16 having an inner diameter of about 16 mm and serving to discharge treating gas is connected to the lower side of the reaction tube 11.

Figure 2:
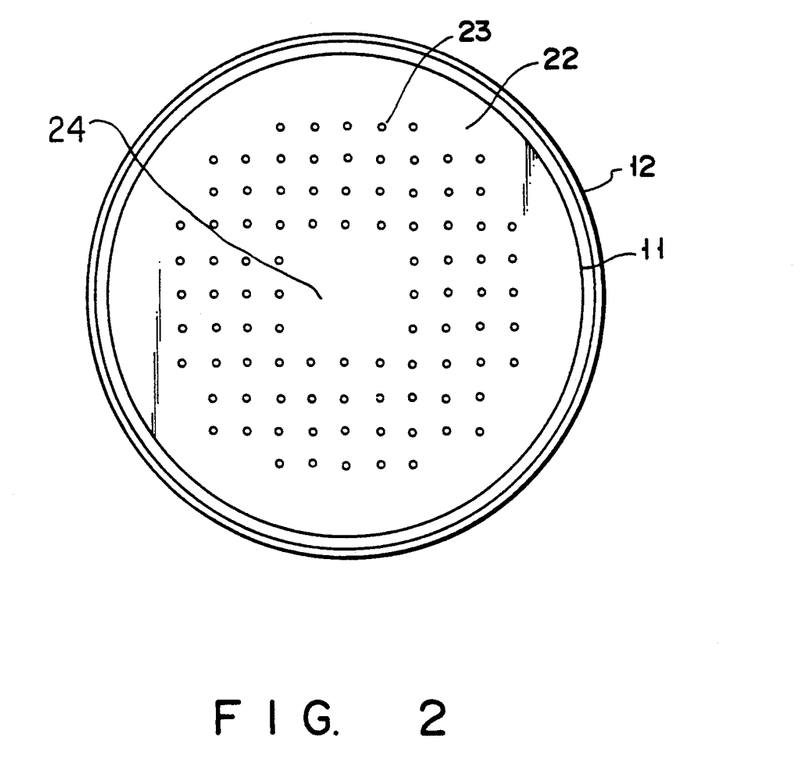
FIG. 2 is a plan showing a diffusion plate in detail.

The top of the reaction tube 11 is provided with a diffusion plate 22 having a plurality of holes 23. 92 units, for example, of the holes 23 each having a diameter of 3 mm are arranged at the diffusion plate 22 as shown in FIG. 2. More specifically, these holes 23 are arranged point-symmetrical relative to the center of the cross section of the reaction tube 11 or center of the diffusion plate 22. A closed portion 24 where no hole 23 is present is formed at the center portion of the diffusion plate 22. This is because it is not efficient to supply treating gas to some dummy wafers 19 located at the upper portion of the boat 20 through the center portion of the diffusion plate 22.

The diffusion plate 22 serves to diffuse the treating gas uniformly in the radial direction of the tube 11 at the time when the treating gas passed through the gas introducing passage 13 is introduced into the reaction tube 11. The inner diameter of each of the holes 23 and the number of them are decided so that the total opening area of the holes 23 is about 5 times the effective sectional area of the gas supply pipe 15. Consequently, the treating gas can be effectively heated until it passes through the holes 23 and that the flow velocity of the gas can be made so slow as to prevent dusts from being created.

A heater 17 is arranged enclosing the outer tube 12. This heater 17 serves originally to keep the temperature in the reaction tube 11 at a predetermined value, but it is also used to pre-heat the treating gas passing through the gas introducing passage 13.

The operation of the diffusion apparatus will be described on a case where oxide film is formed on each of the semiconductor wafers 19 When the wafers 19 are mounted on the boat 20 at their predetermined position and the boat 20 is set in the reaction tube 11, the reaction tube 11 is heated at first to a predetermined temperature by the heater 17. Pressure in the reaction tube 11 is set a little lower than atmospheric pressure by the discharge pump system connected to the gas discharge pipe 16 and treating gas ($O_2$) is supplied to the gas supply pipe 15 under a predetermined supply pressure.

The treating gas flows from down to up, passing through the gas introducing passage 13 between the tubes 11 and 12, and thus reaches the diffusion plate 22 which is the top of the reaction tube 11. The treating gas is heated by the heater 17 while flowing through the gas introducing passage 13, so that it can be pre-heated to a temperature approximate to the one set in the reaction tube 11. In addition, the ring-shaped space between the tubes 11 and 12 is used as the gas introducing passage 13. Therefore, the sectional area through which the treating gas is introduced can be made larger a compared with the conventional apparatuses. Even when the pressure under which the treating gas is supplied and negative pressure in the reaction tube 11 are set the same as those in the conventional cases, therefore, the speed of the gas flowing through the gas introducing passage 13 can be made so low as to keep sufficient the time period during which the gas can be pre-heated.

The treating gas supplied to the diffusion plate 22 on top of the reaction tube 11 in this manner is introduced into the reaction tube 11 through the holes 23 of the diffusion plate 22 while being diffused in the radial direction of the tube 11. The treating gas can be further heated to a predetermined process temperature while being delayed by the diffusion plate 22. This action of the diffusion plate 22 forces the treating gas to be uniformly diffused into the reaction tube 11, thereby obtaining the sectional thermal uniformity of each of the wafers 19.

Further, the treating gas is pre-heated and then introduced into the tube 11. The difference of the temperature of the treating gas relative to the temperature in the reaction tube 11 can be made smaller accordingly. This prevents the downward flow of the treating gas from being less caused by this temperature difference as compared with the conventional cases. In addition, the treating gas can flow downward in the reaction tube 11 while being sufficiently diffused in the radial direction of the tube 11. When the treating gas contacts each of the wafers 19 in the reaction tube 11, therefore, the temperature of the treating gas becomes substantially the same at any position on the face of each of the wafers 19, thereby enhancing the uniformity of the temperature of the treating gas on the face of each of the wafers 19 in the reaction tube 11.

As is described above, the diffusion plate 22 offers a delaying effect to efficiently pre-heat the treating gas in the passage between the tube 11 and 12, and a rectifying effect to uniformly introduce the treating gas into the tube 11. An acceptable difference in temperature between the atmosphere in the tube 11 and the pre-heated gas depends on the type of process, such as film formation and diffusion. In the diffusion process, which tends to be easily influenced by the temperature condition thereof, the acceptable temperature difference is less than 30% of the atmosphere temperature in the tube 11.

Figure 3:
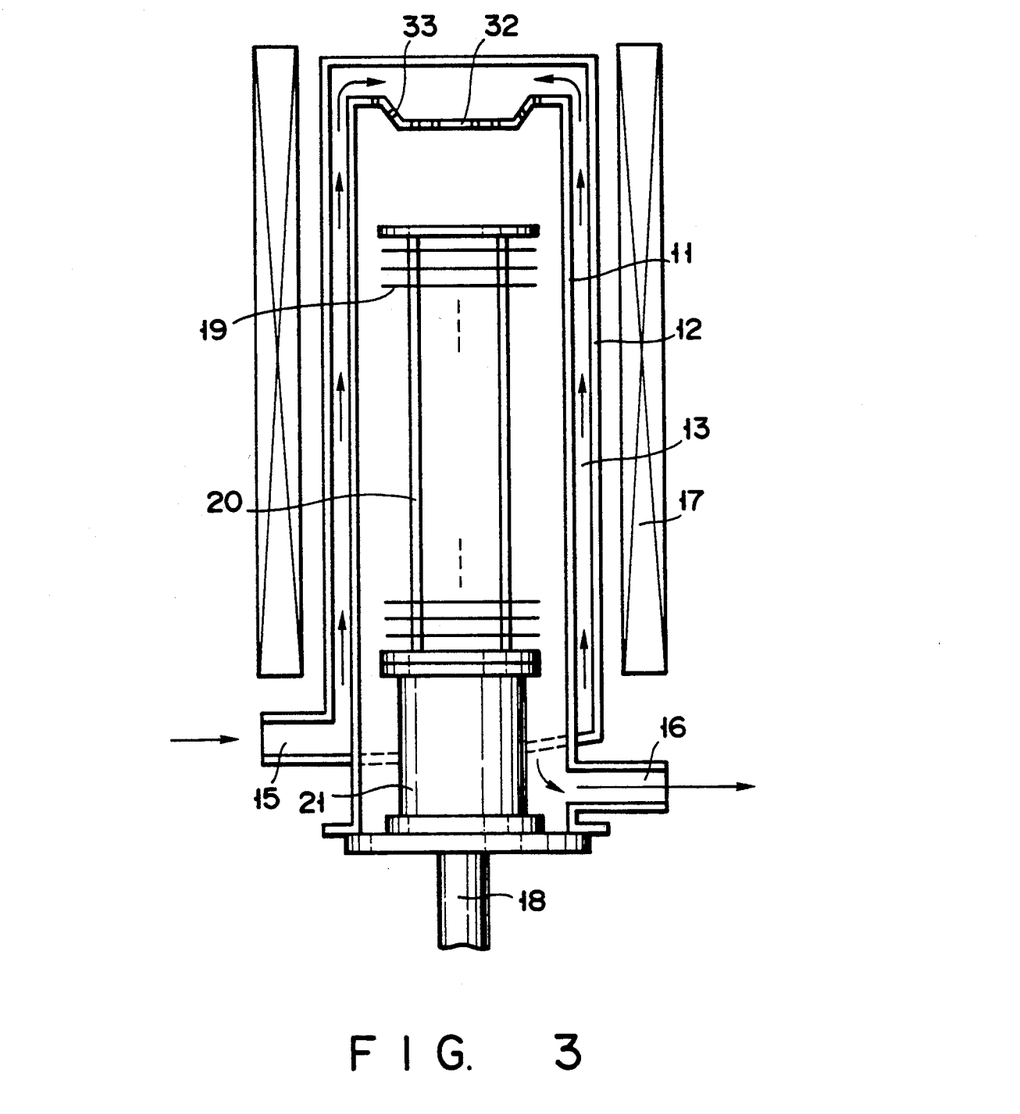
FIG. 3 is a schematic sectional view showing the vertical-type diffusion apparatus according to a second embodiment of the present invention.
Figure 4:
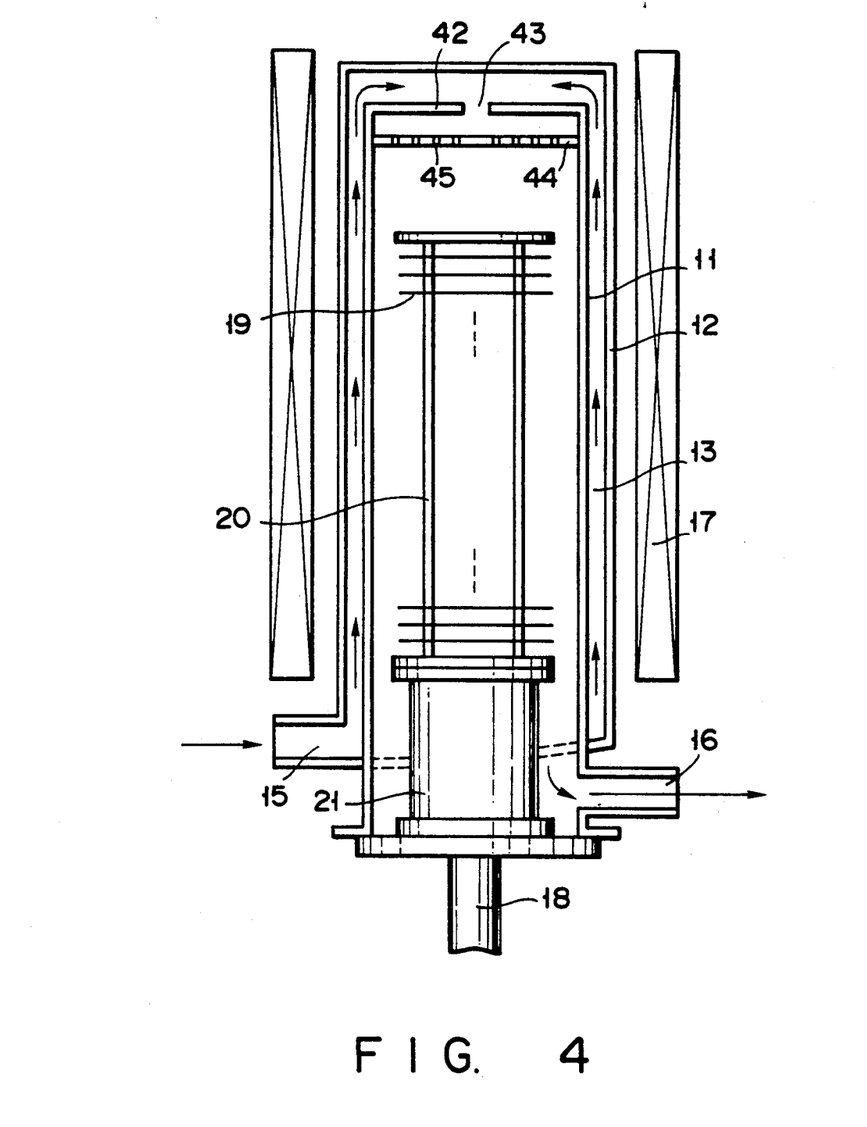
FIG. 4 is a schematic sectional view showing the vertical-type diffusion apparatus according to a third embodiment of the present invention.

FIGS. 3 and 4 show the diffusion apparatuses according to second and third embodiments of the present invention. The same components as those shown in FIG. 1 will be represented by the same reference numerals and description on these components will be omitted.

In the case of the second embodiment of the present invention shown in FIG. 3, a diffusion plate 32 which is the top of the reaction tube 11 is recessed at the center portion thereof and holes 33 are formed mainly at the bottom and tilted side of the recess of the diffusion plate 32. Similarly to the case of the first embodiment, the inner diameter of each of the holes 33 and the number of them are decided so that the total opening area of the holes 33 is about 5 times the effective sectional area of the gas supply pipe 15.

In the case of the third embodiment shown in FIG. 4, an opening 43 is formed at the center of the top of the reaction tube 11. A diffusion plate 44 is located under the opening 43 in the reaction tube 11. The inner diameter of each of holes 45 and the number of them formed at the diffusion plate 44 are decided so that the total opening area of the holes 45 is about 5 times the effective sectional area of the gas supply pipe 15, similarly to the case of the first embodiment.

According to the second and the third embodiment of the present invention, a space having a large volume can be formed at the top of the reaction tube 11 between the diffusion plate and the outer tube 12. Therefore, the time period during which the treating gas remains in this space can be made longer and the treating gas can be heated to the predetermined temperature with a higher certainty, as compared with the case of the first embodiment.

Figure 5:
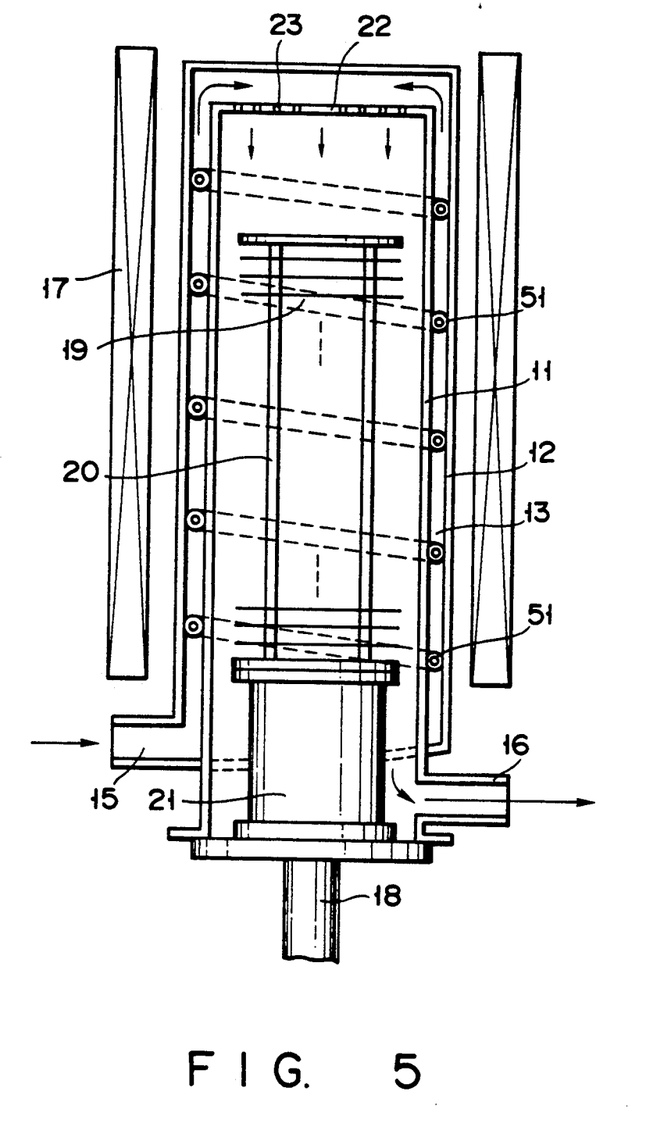
FIG. 5 is a schematic sectional view showing the vertical-type diffusion apparatus according to a fourth embodiment of the present invention.

FIG. 5 shows a fourth embodiment of the present invention. The same components as those in the first embodiment will be denoted by the same reference numerals and description on these components will be omitted.

In this case of this fourth embodiment according to the present invention, a spiral pipe 51 made of quartz is arranged in the gas introducing passage 13 between the tubes 11 and 12. The gas introducing passage 13 is thus formed spiral. The quartz-made pipe 51 has an outer diameter of about 8 mm, which is substantially the same as the width of the space between the tubes 11 and 12. The pipe 51 is formed spiral having an interval of about 100 mm between adjacent spirals (the spiral pipe 51 is not shown correct in dimension in FIG. 5). Since the pipe 51 is a means for partitioning the gas introducing passage 13, it may be replaced by a solid rod made of quartz.

According to the fourth embodiment, the treating gas supplied through the gas supply pipe 15 is preheated by the heater 17 while spirally rising through the gas introducing passage 13, and it then reaches the diffusion plate 22. In other words, the time period during which it is pre-heated can be made longer as compared with the case of the first embodiment, so that it can be heated to the predetermined process temperature with a higher certainty.

Figure 6:
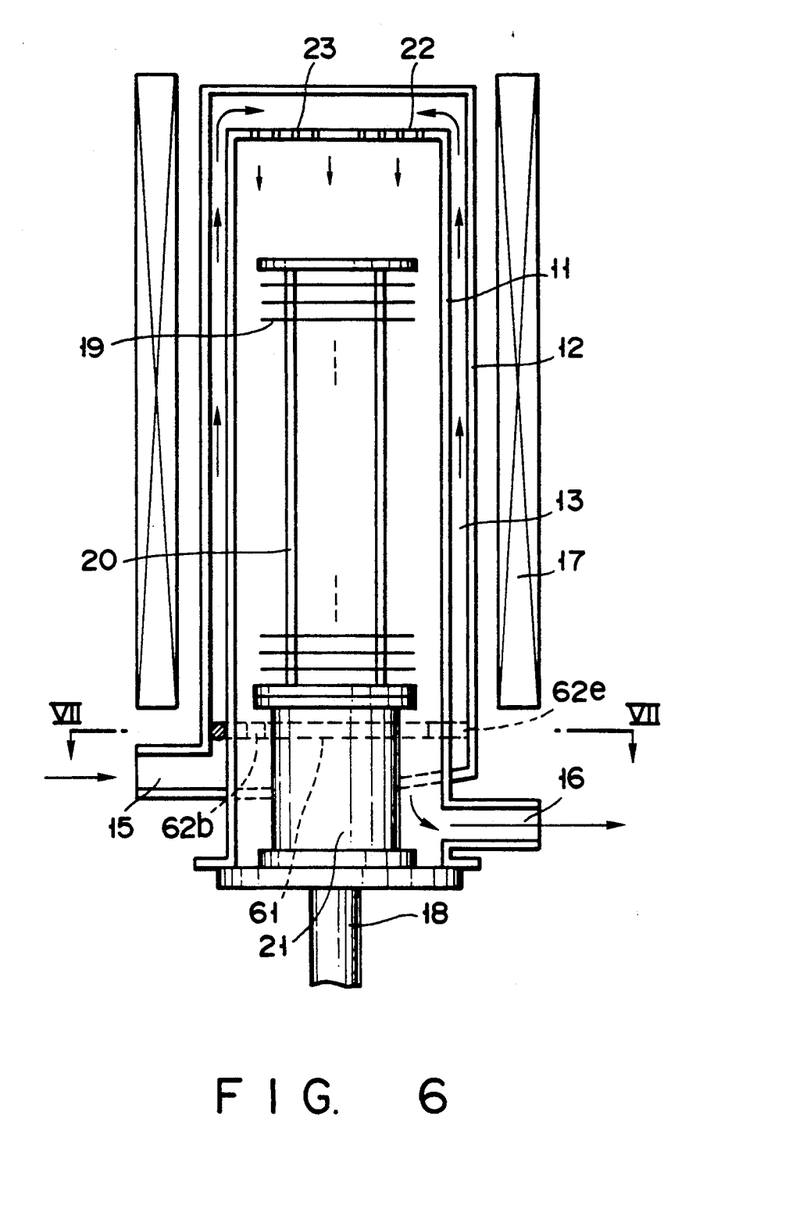
FIG. 6 is a schematic sectional view showing the vertical-type diffusion apparatus according to a fifth embodiment of the present invention.

FIG. 6 shows a fifth embodiment of the present invention. The same components as those in the first embodiment will be represented by the same reference numerals and description on these components will be omitted.

Figure 7:
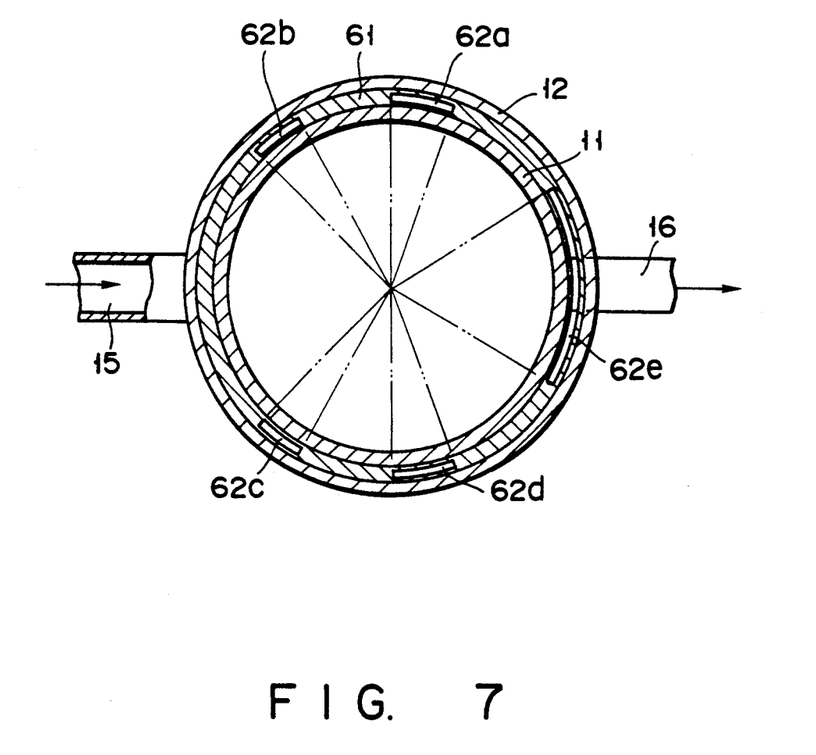
FIG. 7 is a sectional view taken along a line VII—VII in FIG. 6.

In the case of this fifth embodiment, a quartz made distribution ring 61 is located adjacent to the gas supply pipe 15 in the gas introducing passage 13 between the tubes 11 and 12. The ring 61 is provided with gas distributing holes 62a-62e, as shown in FIG. 7. The gas distributing holes 62a-62e become smaller in dimension but larger in interval between them as they come nearer to the gas supply pipe 15. In short, the holes 62b and 62c are the smallest and the hole 62e is the largest in dimension. Further, these gas distributing holes 62a-62e are formed symmetrical in shape and dimension relative to the axes of the gas supply and discharge pipes 15 and 16.

It is important in this case that the open area of the gas distributing holes per unit length of the ring 61 becomes smaller as it comes nearer to the gas supply pipe 15. Instead of the holes 62a–62e in the fifth embodiment, therefore, plural holes, same in dimension, may be formed at the ring 61 in such a way that their density becomes lower approaching the gas supply pipe 15.

According to the fifth embodiment of the present invention, the treating gas supplied through the gas supply pipe 15 can be uniformly distributed around the outer circumference of the reaction tube 11 by the action of the gas distribution ring 61 and it then rises like a laminar flow on the outer circumference of the tube 11. It cannot be therefore maldistributed thereby enabling its pre-heat to be more efficiently conducted, as compared with the case of the first embodiment.

It should be understood that the present invention is not limited to the above-described embodiments and that various changes and modifications can be made without departing from the spirit and scope of the present invention. It may be arranged, for example, that the apparatus according to each of the above-described embodiments is turned upside down and that the gas supply and discharge pipes are located at the upper portion of the apparatus while the diffusion plate at the bottom thereof. The holes of the diffusion plate may be formed at the side of the reaction tube as well as at the top thereof. The diffusion plate is not limited to those which have a plurality of machine-processed small holes but porous ceramic or the like may be used. The present invention may also be applied to the oxide film forming process according to dry or wet oxidation, the oxide film forming process according to halogenation, other film forming processes and heat treatments except those in the case of film formation.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A diffusion apparatus of the vertical type for heat-treating a plurality of objects mounted with intervals therebetween in the vertical direction with a treating gas, comprising:
   a vertical-type reaction tube in which the objects are housed;
   an outer tube coaxially located outside the reaction tube with a space interposed between the reaction and outer tubes, said space being used as a passage for pre-heating the treating gas passing through the space;
   heater means enclosing the outer tube;
   an inlet pipe connected to a substantially lower end of the outer tube, and through which the treating gas is introduced into the space;
   a diffusion plate formed at the reaction tube at the upper end of the space;
   a plurality of diffusion holes formed in the diffusion plate to introduce the treating gas into the reaction tube after the gas passes through the space;
   an outlet pipe connected to a substantially lower end of the reaction tube, and through which the treating gas is discharged from the reaction tube; and
   a distributor ring arranged in and having a width substantially the same as that of the space between the reaction and outer tubes for partitioning the passage for pre-heating, said distributor ring being located above and near a position where the inlet pipe is connected to the outer tube, and having a plurality of gas distribution holes for uniformly distributing the treating gas around the outer circumference of the reaction tube.

2. The diffusion apparatus according to claim 1, wherein the distributor ring is made of quartz.

3. The diffusion apparatus according to claim 1, wherein the gas distribution holes have hole areas which become smaller as they approach the inlet pipe.

4. The diffusion apparatus according to claim 3, wherein the distribution holes are arranged symmetrical in shape relative to a longitudinal center of the inlet pipe.

5. The diffusion apparatus according to claim 1, wherein the diffusion holes are arranged substantially point-symmetrical relative to the center of the cross-section of the reaction tube.

6. The diffusion apparatus according to claim 1, wherein the diffusion plate has a closed portion at the center thereof.

7. The diffusion apparatus according to claim 6, wherein the diffusion plate is located in the reaction tube under the top thereof and an opening through which the treating gas passes is formed at the center and the top of the reaction tube.

8. The diffusion apparatus according to claim 7, wherein the opening is dimensionally smaller than the closed portion.

9. The diffusion apparatus according to claim 1, wherein a distance separating the outer tube from the reaction tube is largest in the vicinity of said diffusion plate.

10. The diffusion apparatus according to claim 1, wherein the diffusion plate is a means for defining the top of the reaction tube.

11. The diffusion apparatus according to claim 1, wherein the outer tube is terminated above the outlet pipe, preventing the outlet pipe from passing through the outer tube.

12. The diffusion apparatus according to claim 11, wherein the inlet and outlet pipes are arranged to form an angle of 180° therebetween in a horizontal plane.

13. The diffusion apparatus according to claim 12, wherein the outer tube has a bottom inclined downward from a portion located above the outlet pipe to the inlet pipe.

14. A diffusion apparatus of the vertical type for heat-treating a plurality of objects mounted with intervals therebetween in the vertical direction with a treating gas, comprising:
   a vertical-type reaction tube in which the objects are housed;
   an outer tube coaxially located outside the reaction tube with a space interposed between the reaction and outer tubes, said space being used as a passage for pre-heating the treating gas passing through the space;
   heater means enclosing the outer tube;
   an inlet pipe connected to a substantially lower end of the outer tube, and through which the treating gas is introduced into the space;
   a diffusion plate formed at the reaction tube at the upper end of the space;
   a plurality of diffusion holes formed in the diffusion plate to introduce the treating gas into the reaction tube after the gas passes through the space;

an outlet pipe connected to a substantially lower end of the reaction tube, and through which the treating gas is discharged from the reaction tube; and a spiral partition member arranged in and having a width substantially the same as that of the space between the reaction and outer tubes for partitioning the passage for pre-heating such that the passage is formed spiral and extends from the inlet pipe to the diffusion plate.

15. The diffusion apparatus according to claim 14, wherein the diffusion holes are arranged substantially point-symmetrical relative to the center of the cross section of the reaction tube.

16. The diffusion apparatus according to claim 14, wherein the diffusion plate has a closed portion at the center thereof.

17. The diffusion apparatus according to claim 14, wherein a distance separating the outer tube from the reaction tube is largest in the vicinity of said diffusion plate.

18. The diffusion apparatus according to claim 14, wherein the diffusion plate is a means for defining the top of the reaction tube.

19. The diffusion apparatus according to claim 14, wherein the diffusion plate is located in the reaction tube under the top thereof and an opening through which the treating gas passes is formed at the top of the reaction tube.

20. The diffusion apparatus according to claim 14, wherein the partition member is a rod-like member made of quartz.

* * * * *